(12) United States Patent
Dimou (10) Patent No.: US 7,698,624 B2
(45) Date of Patent: Apr. 13, 2010

(54) SCHEDULING PIPELINED STATE UPDATE FOR HIGH-SPEED TRELLIS PROCESSING

(75) Inventor: Georgios D. Dimou, San Diego, CA (US)

(73) Assignee: TrellisWare Technologies, Inc., San Diego, CA (US)

( * ) Notice: Subject to any disclaimer, the term of this patent is extended or adjusted under 35 U.S.C. 154(b) by 1048 days.

(21) Appl. No.: 11/396,348

(22) Filed: Mar. 31, 2006

(65) Prior Publication Data

US 2007/0234187 A1 Oct. 4, 2007

(51) Int. Cl.
*H03M 13/03* (2006.01)
(52) U.S. Cl. .................. 714/792; 714/794; 714/795
(58) Field of Classification Search ............... 714/792, 714/794, 795
See application file for complete search history.

(56) References Cited

U.S. PATENT DOCUMENTS

| 5,933,462 | A | 8/1999 | Viterbi et al. |
| 5,935,270 | A * | 8/1999 | Lin ........................ 714/795 |
| 2001/0046269 | A1 | 11/2001 | Gatherer et al. |
| 2004/0117721 | A1 | 6/2004 | Parhi |
| 2005/0044474 | A1 * | 2/2005 | Zaboronski et al. ......... 714/794 |
| 2005/0060633 | A1 | 3/2005 | Parhi |

FOREIGN PATENT DOCUMENTS

WO    WO 00/59118 A    10/2000

OTHER PUBLICATIONS

Arguello et al. High-Speed Viterbi Decoder: An Efficient Scheduling Method to Exploit the pipelining, 1996, !EEE, pp. 165-174.*
Wang, et al., "Area-Efficient High-Speed Decoding Schemes for Turbo Decoders," IEEE Transactions on Very Large Scale Integration (VLSI) Systems, IEEE Service Center, Piscataway, NJ, US, vol. 10, No. 6, (Dec. 2000) XP011080598 ISSN:1063-8210.
International Search Report.

* cited by examiner

*Primary Examiner*—Sam Rizk
(74) *Attorney, Agent, or Firm*—Townsend and Townsend and Crew, LLP (57) ABSTRACT

Methods, apparatuses, and systems are presented for extracting information from a received signal resulting from a process capable of being represented as a finite state machine having a plurality of states, wherein transitions between the states can be represented by a trellis spanning a plurality of time indices, involving calculating branch metrics taking into account the received signal, calculating state metrics at each time index by taking into account the branch metrics and using a pipelined process, wherein the pipelined process is used to calculate state metrics at a first time index, wherein the pipelined process is then used to calculate state metrics at one or more non-adjacent time indices, and wherein the pipelined process is then used to calculate state metrics at an adjacent time index, and generating at least one output taking into account state metrics for states associated with at least one selected path through the trellis.

31 Claims, 8 Drawing Sheets

(M = 3 Sections)

SCHEDULING PIPELINED STATE UPDATE FOR HIGH-SPEED TRELLIS PROCESSING

BACKGROUND OF THE INVENTION

The transmission of data through a noisy channel could introduce errors into the data stream. In order to reduce the amount of errors in the transmitted sequence and to avoid retransmissions coding techniques have been developed that provide the ability to detect and correct errors in a sequence. This is achieved usually through the addition of redundant information as part of the transmission. Here the term transmission is used broadly to include transfer of data through different types of medium. This can include communication mediums such as those used in wired, wireless, satellite, and other technologies. This can also include storage mediums such as magnetic, semiconductor, and other types of memory.

Some of the most popular and powerful coding techniques use convolutional codes either standalone or in more complex arrangements that include multiple codes, such as Parallel concatenated Convolutional Codes (PCCC or Turbo), Serially Concatenated Convolutional Codes (SCCC) and other Turbo-Like Codes (TLC). Although regular convolutional codes and TLCs differ significantly in terms of performance, structure and decoding techniques, their decoders share some common features.

The decoding structures that are used to decode convolutional codes are based on trellis processing. A trellis is a representation of the state of the encoder state machine unfolded over time. The trellis is used to estimate the state of the convolutional encoder finite state machine over time based on the information attained from the received signal.

As a special case, one could also classify in the same category codes that are based on single parity check codes since they too could be decoded using a trellis based structure. The parity check state machine can be viewed as a 2-state state machine of a convolutional code, with the parity bit being the termination of that code. So a single parity check code of length K could be viewed and decoded as a terminated 2-state recursive convolutional code of length K+1.

The traditional algorithm for decoding the trellis in the case of a convolutional code involves processing one step at a time through the trellis from beginning to end updating the state metrics in the process. The state metrics are updated using branch metrics that are calculated from the observations for the received sequence collected on the receiver. Each path along the trellis is thus associated with a cost that -corresponds to the likelihood of that sequence being transmitted. The decoder then either makes "hard" decisions about the decoded sequence, a process known as Viterbi algorithm, or produces soft metrics that correspond to the likelihood of a bit that was transmitted assuming a particular value, a process known as Soft Output Viterbi Algorithm or SOVA.

In the case of TLCs, the traditional decoding algorithm, which is known as Forward-Backward Algorithm, processes the trellis in both directions updating the state metrics the same way as the Viterbi algorithm. The state metrics from the two passes along with the branch metrics are then used to generate soft outputs for each bit of interest along the trellis. The module that performs this process is called the Soft-In-Soft-Out or SISO module. In the case of the TLCs there is one such SISO module that corresponds to each convolutional code in the encoder and each SISO passes data to the others and the process iterates until some criterion is met, at which time "hard" decisions are made. Such criteria could be the maximum number of iterations was reached, convergence to a solution was achieved, etc.

The challenge in trellis-based processing is its recursive nature. Both in the case of Viterbi decoders and of SISO modules the critical path of the processing is the state-update process. The processing of each step through the trellis depends on the values generated for the previous step (or the next step if processing backwards). This data dependency means that the next step cannot be processed until the previous one is done processing. In the basic approach that also means that the whole trellis has to be processed in series by the same processor.

Some techniques have been developed that allow a designer to break a trellis into sections (such as windows or tiles), thus breaking the process in smaller blocks that could be processed in parallel. The basic concept is described in U.S. Pat. No. 5,933,462 issued to Viterbi. Instead of decoding the entire block of size K, U.S. Pat. No. 5,933,462 describes an algorithm for decoding over a window of size L instead to reduce memory requirements. The concept can be extended in the forward direction as well and used to break the block of size K trellis sections into smaller independent sections of size L.

However, this does not solve the data dependency problem, and current hardware implementations of trellis processors are constrained to be as fast as the execution of the recursive state-update calculations. When designers wish to speed up the process they often use multiple state-update units in parallel for different sections of the trellis, in order to achieve the required speed. However, such an approach has inherent disadvantages. For one thing, parallel state-update units for different sections of the trellis likely require numerous simultaneous memory accesses and that translates into very wide memories and several constraints, in order to guarantee that the accesses yield no collisions. Furthermore, the amount of logic required for the trellis-processing engine increases linearly with the number of these parallel units used.

Therefore, there remains a significant need for more efficient trellis-based decoding techniques. This is especially true in performing state-update calculations, which can involve recursive operations.

BRIEF SUMMARY OF THE INVENTION

The present invention relates to methods, apparatuses, and systems for extracting information from a received signal resulting from a process capable of being represented as a finite state machine having a plurality of states, wherein transitions between the states can be represented using a trellis spanning a plurality of time indices, the trellis comprising the plurality of states at each time index. The methods, apparatuses, and systems may involve calculating branch metrics corresponding to transitions from one state to another state, taking into account the received signal, calculating state metrics corresponding to states at each time index by taking into account the branch metrics and using a pipelined process, wherein the pipelined process is used to calculate state metrics at a first time index, wherein the pipelined process is then used to calculate state metrics at one or more non-adjacent time indices that are not adjacent to the first time index, without using results from the calculation of state metrics corresponding to states at the first index, and wherein the pipelined process is then used to calculate state metrics at an adjacent time index that is adjacent to the first time index, using results from the calculation of state metrics at the first index, and generating at least one output by taking into account state metrics for states associated with at least one selected path through the trellis.

The trellis can be divided into multiple sections, each section spanning a smaller plurality of the plurality of time indices, wherein the first time index is a time index from a first section of the trellis, wherein the one or more non-adjacent time indices are time indices from one or more other sections of the trellis, and wherein the adjacent time index is another time index from the first section of the trellis. The pipelined process may thus be used to calculate state metrics at time indices from different sections of the trellis in a round-robin manner.

According to one embodiment, the pipelined process comprises N stages, N being a positive integer, and wherein the trellis is divided into M sections, M being a positive integer equal to N. According to another embodiment, M is a positive integer greater than N and is a multiple of N.

The calculation of state metrics may comprise calculation of forward state metrics and/or backward state metrics. In one embodiment, the pipelined process is configured to perform at least one add-compare-select (ACS) operation.

The pipelined process may be implemented in hardware using gated logic, which may be part of an Application Specific Integrated Circuits (ASIC) design, a Very Large Scale Integrated Circuits (VLSI) design, a Field Programmable Gate Arrays (FPGA) design, and/or others.

Further, the calculation of branch metrics, as well as the generation of the at least one output, may also be performed using pipelined processes.

According to various embodiments of the present invention, techniques involving windowing and/or tiling can be combined with a pipelined state-update unit and an interlacing scheduling algorithm to improve the speed of processing of trellis-based calculations. This allows a single state-update unit to be used in the place of multiple state-update units. Importantly, the trellis-based calculations can be performed with less constraint relating to the recursive nature of state-update values. Benefits include significantly reduced circuit area in hardware implementations. Furthermore, memory access characteristics are greatly improved.

DETAILED DESCRIPTION OF THE INVENTION

I. System Description

Figure 1:
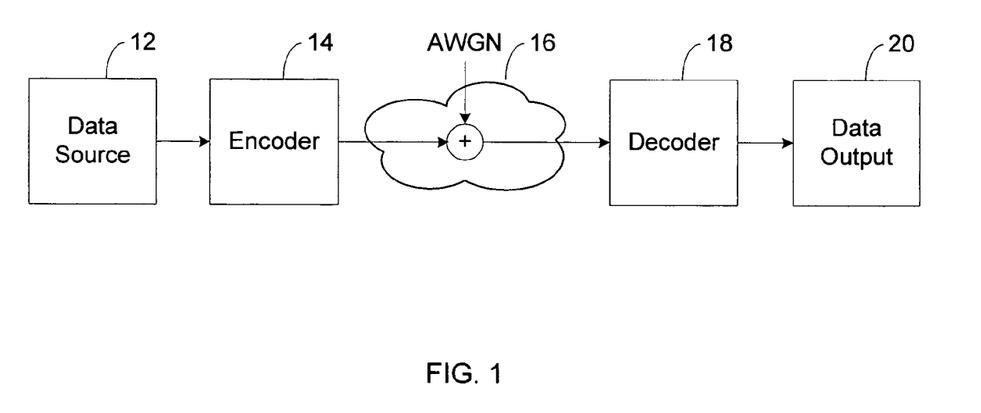
FIG. 1 shows a digital communication system employing a convolutional encoder.

FIG. 1 shows a digital communication system 10 employing a convolutional encoder 14. Convolutional encoder 14 may employ a standalone convolutional code or more complex arrangement that includes multiple codes, such as PCCC, SCCC, and other Turbo-Like Codes, as mentioned previously. Encoder 14 is an example of one of the many processes that can be modeled as a finite state machine (FSM). Other such processes include, but are not limited to, encoders based on other types of codes, near-capacity multi-user detection, near-optimal two-dimensional data detection, fading channels, and inter-symbol interference (ISI) channels.

Referring to FIG. 1, the digital communication system 10 includes a data source 12 providing symbols defined on a closed set of symbols. For example, if a binary closed set of symbols is used, the symbols are selected from {0, 1}. The symbols from the data source 12 are forwarded to encoder 14, which converts the symbols into encoded symbols according to the structure of encoder 14. The encoded symbols are then sent through a channel 16, which can add noise, such as additive white Gaussian noise (AWGN), and distortions to the encoded symbol to produce a received signal. Soft information relating to the received signal is sent to a decoder 18. Decoder 18 outputs soft information regarding the symbols which can be thresholded to produce hard-decision decoded symbols.

The digital communication system shown in FIG. 1 is a functional block diagram providing an illustrative example of basic functions. Different functions may be added or omitted. Also, application of the innovative methods discussed herein is not limited to this specific block diagram. Similarly, other block diagrams discussed below are merely illustrative examples and do not limit the applicability of the methods discussed herein.

Figure 2:
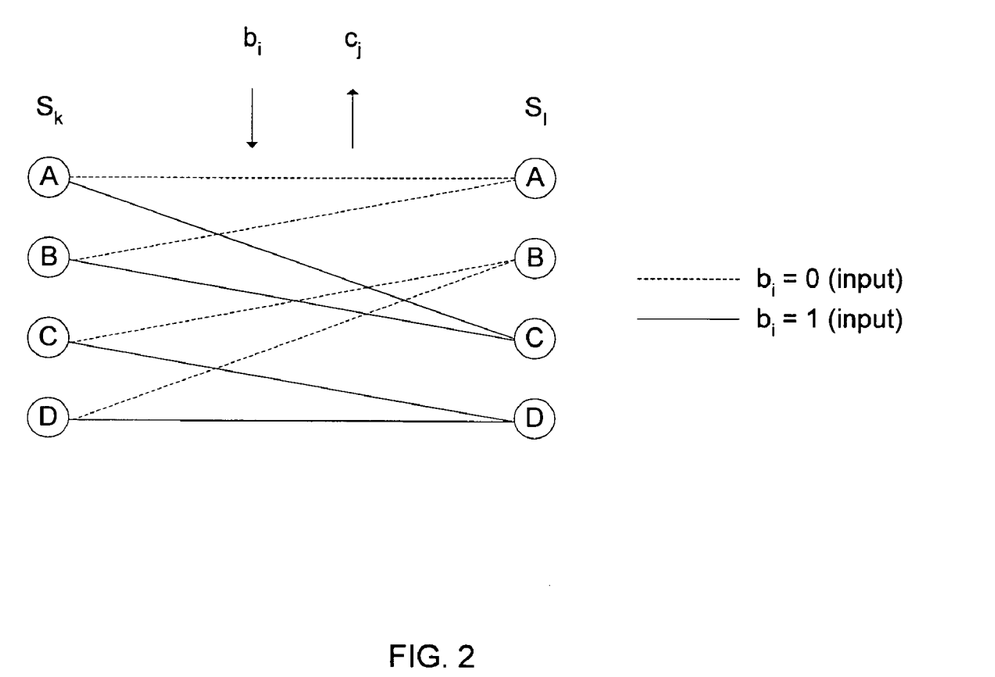
FIG. 2 shows a section of a trellis describing an FSM which models a process such as convolutional encoding, ISI interference, and others.

FIG. 2 shows a section of a trellis describing an FSM which models a process such as convolutional encoding, ISI interference, and others. Generally speaking, an FSM has P states $S=\{S_1, S_2, \ldots, S_p\}$. The number of states P is a function of the memory length of the FSM. The state of the FSM at time k is $S_k = S_i \in S$.

Each transition from one state to another state involves n inputs and m outputs.

The trellis transition from one state $S_k$ (source state k) to another state $S_1$ (target state 1) is deterministically driven by inputs symbols $b_i$, i=1 ... n, to the FSM. Input symbols $b_i$ may be provided by a data source such as data source 12. Thus, each state transition is characterized by a combination of values for each input and output symbol as well as the starting and target state.

Each input symbol $b_i$ is drawn from the M-ary closed set of symbols. For ease of illustration, in subsequent sections, $b_i$ is assumed to be drawn from a 2-ary closed set of symbols {0, 1}. In other words, the input symbols $b_i$ are assumed to be binary (bits). Similarly, the output symbols $c_j$, j=1 ... m, from the FSM are also assumed to be binary (bits).

The specific example shown in FIG. 2 is a FSM with four states (P=4), with each state transition involving one input bit $b_i$ (n=1) and one output bit $c_j$ (m=1). The target state 1 is determined by the source state k and the input bit $b_i$ (only one input bit $b_i$ in this case). Thus, each source state can transition to two possible target states. Also, each target state can come from two possible source states. The output bit $c_j$ (only one output bit $c_j$ in this case) is determined by the state transition from source state k to target state 1. The particular values of P, n, and m provided in FIG. 2 are merely illustrative. These values may vary depending on the code implemented.

II. Metrics Calculations for Decoding

Decoding performed by a decoder such as decoder 18 may involve branch metrics and state metrics. Such metrics are associated with the likelihood that at a particular point in time through the transmission, the encoder FSM is in a particular state or is transitioning from a particular state to another particular state. The metrics are calculated by processing along the trellis and using a posteriori probabilities from the received signal.

Specifically, branch metrics relate to the probability associated with transitioning from one state to another. As is known in the art, branch metrics are typically calculated by taking into account the received signal. Thus, given the received signal, the a posteriori probability for each branch along the trellis can be formed by the probabilities that are known for all bits along that particular branch. A value representing such an a posteriori probability is considered a branch metric.

State metrics relate to the probability associated with being in a particular state. State metrics are generally calculated using the branch metrics, by calculating the probability for each state along the trellis starting from an initial state and processing one time index at a time. The resulting probability for each state, also known as a state metric, represents the probability of the encoder FSM being at a particular state at a particular time given the received probabilities or branch metrics from the beginning of the trellis up to that point.

Generally, branch metrics and state metrics are defined in terms of some reliability measure associated with the likelihood that particular input symbols and/or output symbols would take on certain values. As is known in the art, there are many types of the reliability measures that can be used. For ease of illustration, the type of reliability measure known as normalized log-likelihood metrics is adopted here. Other types of reliability measures are well known and can also be used. The relationship between the different types of reliability measures is well understood in the field. Thus, the techniques described here can be easily extended to other types of reliability measures.

Here, the normalized log-likelihood metrics are defined for each symbol $Z_k$, which can represent either an input symbol $b_i$ or an output symbol $C_j$. Again for ease of illustration, each input or output symbol is described here as being binary in nature (bit). The normalized log-likelihood metrics include soft reliability measures such as soft inputs (SI) and soft outputs (SO). Soft inputs SI is first described below.

A soft input metric SI representing a bit can be defined as the logarithm of the probability of that bit being a 1 minus the logarithm of the probability of that bit being a 0. This forces the value that represents the likelihood of a 1 to become a signed quantity, and the likelihood of a 0 to be always equal to 0. This representation is very practical since only one quantity is required to represent each bit. Mathematically that can be formulated for any bit $Z_k$ as follows.

$$SI_{z_k} = \log(P\{z_k=1\}) - \log(P\{z_k=0\}) \quad (1)$$

III. The Min-Sum Algorithm

Figure 3:
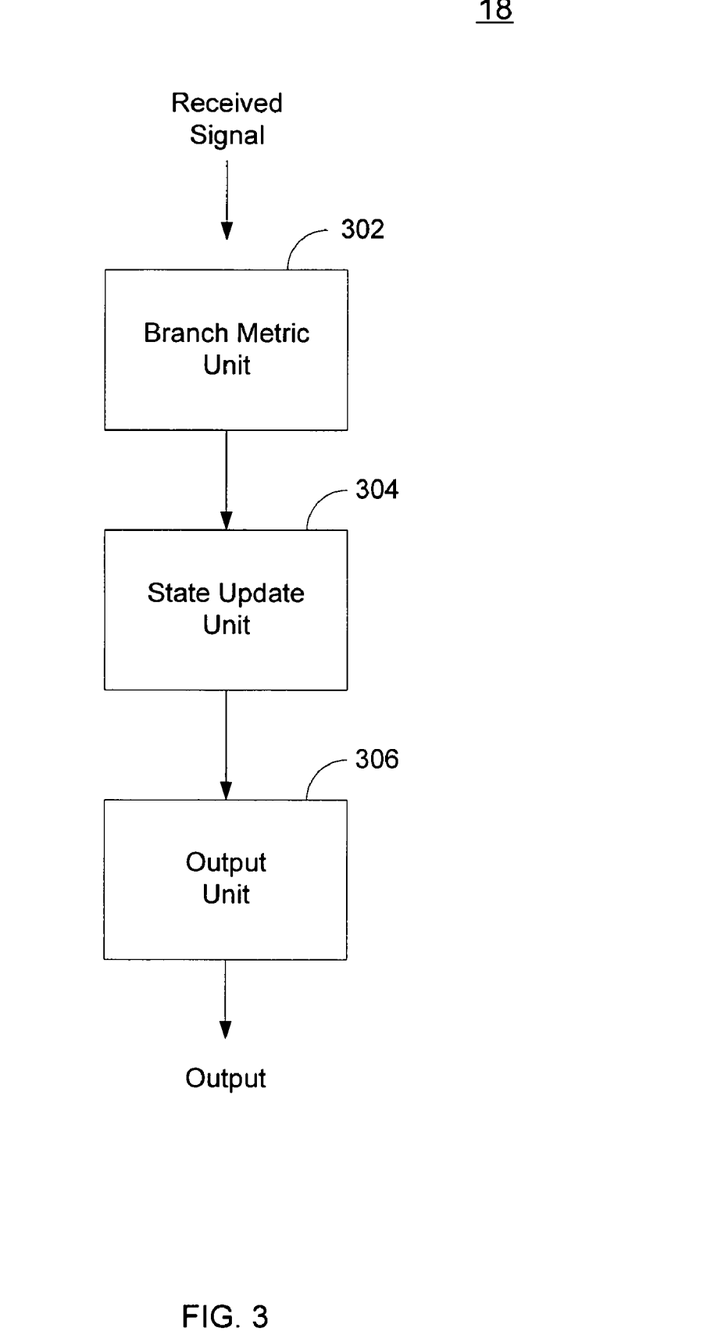
FIG. 3 is a block diagram showing further details of a trellis-based decoder according to an embodiment of the present invention.

FIG. 3 is a block diagram showing further details of decoder 18 according to an embodiment of the present invention. As shown in this figure, decoder 18 includes a branch metric unit 302, a state-update unit 304, and an output unit 306. These are shown as separate units here but may be implemented either separately or in an integrated fashion.

The first step of the trellis processing is performed by branch metric unit 302. Branch metric unit 302 calculates the Branch metrics for each trellis section. Given the present notation, the Branch metric for a transition between two states is equal to the sum of the soft input metrics SI for all bits $b_i$ and $c_j$ for which the corresponding bit assumes the value of 1 on that particular branch. Thus, the Branch metrics $BM_{k,l}^t$, in the trellis at time t starting at state k and ending at state l can be defined follows.

$$BM_{k,l}^t = \sum_{i,b_i=1} SI_{b_i}^t + \sum_{j,c_j=1} SI_{c_j}^t \quad (2)$$

It is clear that this part of the process comprises just a set of additions with no data dependencies and therefore, it could be implemented as a feed-forward datapath and could be easily pipelined as finely as required to be at least as fast as the next step of the trellis processing, which is the state-update operation.

The second step of the trellis-based processing is performed by state-update unit 304. State-update unit 304 calculates the state metrics for each trellis section. This is also referred to as the "state-update" operation. The state metrics are typically defined recursively. That is, the state metric of a target state may be defined as a function of the state metrics of one or more source states that leads to the target state. Such recursive calculations are described in further detail below.

Here, state metrics calculations are performed using a min-sum processing algorithm. However, as one of skill in the art would appreciate, the teachings of the present invention are applicable to other choices of algorithms, such as max-product, sum-product, min*-sum, and max*-sum algorithms (or any of their approximations). All these sets of operations share similar properties, since they are all pairs of operations that define a semi-ring with the set of probabilities that are used for the state and branch metric calculations.

As is known in the art, state metrics can include Forward state metrics and Backward state metrics. According to an embodiment of the invention, the Forward state metrics at time t is defined as $F_k^t$, k=1 . . . P, and t=0 . . . K. Backward state metrics at time t is defined as $B_k^t$, k=1 . . . P, and t=0 . . . K. Here, n is the number of inputs, and m is the number of outputs, associated with each state transition. P is the number of states of the FSM, and K is the length of the decoded codeword or block size.

The use of forward and backward state metrics can vary depending on the type of decoder implemented. For example, if the decoder comprises a Soft-Input-Soft-Output (SISO) module, which is typically used for decoding Turbo-like codes (TLC), both forward state metrics and backward state metrics may be calculated. If the decoder is a basic Viterbi decoder, only forward state metrics may need to be calculated. Both forward and backward state-update operations are described below.

According to the min-sum algorithm, the state-update operation takes all transitions leading to a target state and adds the corresponding branch metric to the source state metric and then sets the target state metric to the minimum of all possible sums. So similarly, the equations for this processing step can be written as follows. Note that in both the Forward case and Backward case, the operation is defined over all valid transitions between states k and l.

$$F_l^{t+1} = \min_k\{F_k^t + BM_{k,l}^t\} \quad (3)$$

$$B_k^t = \min_l\{B_l^{t+1} + BM_{k,l}^t\} \quad (4)$$

Just as an example, one illustrative Forward state metric calculation is described below. Referring back to FIG. 2, there are two possible source states k (state "A" and state "B") at time index t that could have lead to a particular target state 1 (state "C") at time index t+1. Time index t and time index t+1 are examples of adjacent time indices. Thus, the calculation of the Forward state metric $F_l^{t+1}$ associated with the target state "C" at time t+1 is based on the comparison of two sums. The first sum is the addition of the Forward state metric $F_k^t$ at time t associated with the first possible source state "A" with the branch metric $BM_{k,l}^t$ at time t associated with the transition from state "A" to state "C." The second sum is the addition of the Forward state metric $F_k^t$ at time t associated with the second possible source state "B" with the branch metric $BM_{k,l}^t$ at time t associated with the transition from state "B" to state "C." The smaller of the two sums (or the smallest in a group of more than two sums in cases where more than two source states could have lead to the target state) is selected as the new Forward metric $F_l^{t+1}$ at time t+1 for target state "C."

Thus at each time index t+1, a Forward state metric is calculated for every state. The calculation is based on the Forward state metrics for states of the previous time index t and appropriate branch metrics. These Forward state metrics calculations are repeated at each time index, moving from left to right in the context of FIG. 2. Thus, the Forward state metrics are said to be recursively calculated in the forward direction.

The calculation of Backward state metrics can be performed in a similar manner, but in the other direction. Thus at each time index t, a Backward state metric is calculated for every state. The calculation is based on the Backward state metrics for states of the subsequent time index t+1 and appropriate branch metrics. These Backward state metrics calculations are repeated at each time index, moving from right to left in the context of FIG. 2. Thus, the Backward state metrics are said to be recursively calculated in the backward direction.

It is obvious that this part (state metrics calculations, or "state updates") of the trellis processing includes a data dependency since the process is recursive, which is why this part of the process is considered the bottleneck of trellis processing in conventional designs.

The third step of the trellis-based processing is performed in the output unit 306. This step is different between a Viterbi decoder and a turbo decoder. That is, decoder 18 may represent a Viterbi decoder. In that case, the system just performs a trace-back through the trellis reporting the most likely path and from that it derives the most likely sequence of bits that was transmitted. Therefore it is a "hard" decision making algorithm. Alternatively, decoder 18 may represent a turbo decoder. As is well known in the art, there may be a plurality of Soft Input Soft Output (SISO) modules in such a turbo decoder. Units 302, 304, and 306 may represent components within one (or more) of these SISO modules. In that case, soft outputs are calculated instead of hard decision, so that the system can then iterate between the different SISO modules until it converges to a solution.

The calculation of the Soft Outputs (SO) is based on the state metrics calculated in the second step of the processing performed by the state-update unit 304 and the branch metrics that were calculated in the first step of the processing performed by the branch metrics unit 302. The process is also known as soft output calculation or completion operation. The expression that describes the soft output calculation for any bit $z_i$, where $z_i$ could be either an input or output bit to the FSM is as follows.

$$SO_{z_i}^t = \min_{k,l,z_i=1} \{F_k^t + BM_{k,l}^t + B_l^{t+1}\} - \min_{k,l,z_i=0} \{F_k^t + BM_{k,l}^t + B_l^{t+1}\} - SI_{z_i}^t \quad (5)$$

Operations of the output unit 306, for both the trace-back algorithm for the Viterbi decoder, as well as the completion operation for the SISO module of a turbo decoder, are also processes with no data dependencies. Therefore in a hardware implementation they could also be implemented with a feed-forward datapath that could be pipelined as finely as required to match or exceed the speed of the state-update operation.

III. Tiled and Windowed Decoding

Figure 4:
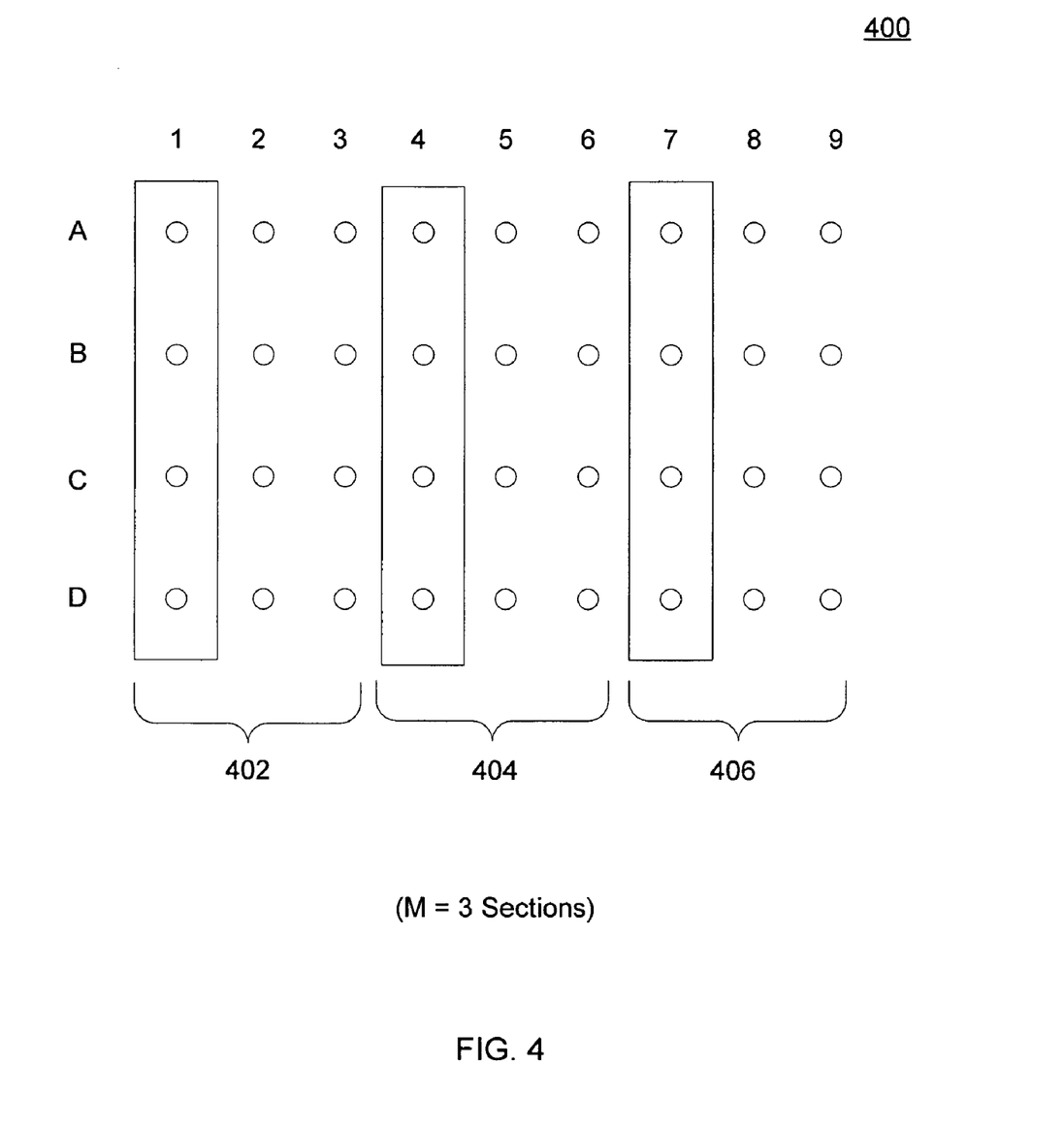
FIG. 4 illustrates the dividing of a trellis into multiple sections for which decoding can be performed separately, according to one embodiment of the present invention.

FIG. 4 illustrates the dividing of a trellis 400 into multiple sections 402, 404, and 406 for which decoding can be performed separately, according to one embodiment of the present invention. Trellis 400 is shown to span nine time indices labeled as 1 through 9. At each time index, trellis 400 includes four possible states "A," "B," "C," and "D." Here, trellis 400 is divided into three (M=3) sections 402, 404, and 406. Section 402 spans time indices 1 through 3, section 404 spans time indices 4 through 6, and section 406 spans time indices 7 through 9. The particular number of states and time indices shown in FIG. 4 is simplified for clarity of illustration. An implementation can very well include more states and more time indices.

Organizing trellis 400 into different sections can facilitate more efficient processing. The discussions prior to FIG. 4 have thus far implied that the entire block of data has to be processed sequentially by the trellis-processing engine. However, techniques have been developed to allow one to decouple portions of the trellis and process them separately, such as in parallel. Two terms that are very frequently used and that have become very popular among designers are the concepts of tiling and windowing.

Both concepts are based on the same theoretical background and they can be used separately or simultaneously depending on the application. Also the concept of tiling is applicable to a Viterbi decoder as well as a SISO design, while the concept of windowing is associated mainly with SISO modules.

Tiling is related to breaking a block into smaller pieces in order to decouple sections of the trellis and process them in parallel. For example if one wishes to accomplish a certain throughput that would require M units in parallel then that would translate into breaking the block into M tiles of equal length if possible and processing each one in a different processor.

On the other hand windowing is viewed more as a memory and latency reduction technique and is employed even in one processing engine. The goal is to reduce the length of the backward recursion over a window only, instead over the entire trellis length, so that the backward state metrics that have to be stored are less and so that the soft output calculation can start earlier. The same solution could be applied to the forward recursion if desired, but that is rarely used since it does not have as big of an impact.

After a certain amount of nodes along the trellis has been processed, the metrics tend to converge to reliable state metrics, even if the starting point is not at the beginning of the trellis, but sufficient length L before the point in question. The sufficient length L is usually 5 to 7 times the amount of memory elements in the encoder FSM. The principle could be applied as easily in the forward and backward recursion. A very common practice is to break the trellis in segments of equal length L. The forward recursion processes forward in the regular fashion over the entire trellis length. The backward recursion is executed on segments that are 2 L long. The first L elements are used to train or "warm up" the backward recursion and the second L elements are used by the SISO to produce soft outputs. That way the maximum latency is 2 L for the backward recursion and the maximum amount of memory required for backward metrics is L. Two processors are used typically in the backward direction, alternating with each other, to keep up with the forward processor.

Since the concept is applicable to SISO designs that are used in iterative decoding processes there is an additional improvement that could be made to this execution algorithm. The state metrics from the previous iteration could be used as startup metrics between the windows of length L. What that means is that the training is no longer required and that the backward recursion only needs to run for a length of L that can be used for decoding immediately. That reduces the latency by another factor of L, and also eliminates the need for the second backward processor, since now it can be processing at the same speed as the forward one. This improvement could also be applied in the case where tiles are used.

IV. Pipelining the State-update Operation

Figure 5:
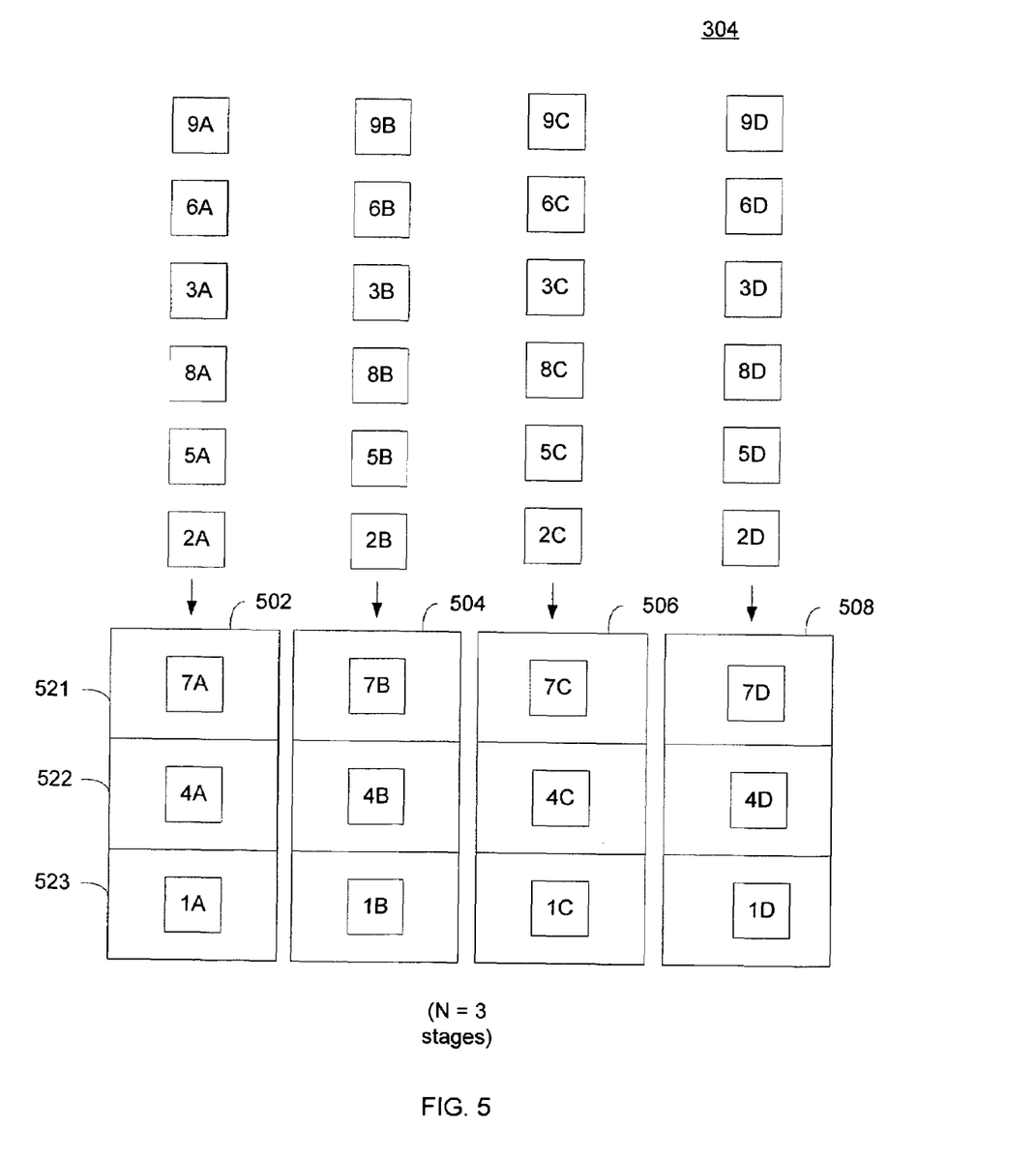
FIG. 5 depicts details of a pipelined state-update unit according to an embodiment of the present invention.

FIG. 5 depicts details of a pipelined state-update unit 304 according to an embodiment of the present invention. Here, pipelined state-update unit 304 comprises four individual pipelined Add-Compare-Select (ACS) units 502, 504, 506, and 508, which operate in parallel to compute state metrics for different states at each time index of a trellis.

For example, referring back to FIG. 4, the calculation of four state metrics, one for each of the states "A" through "D" at time index "1" of trellis 400 can be accomplished by operation of pipelined ACS units 502, 504, 506, and 508 in parallel. Pipelined ACS unit 502 calculates the state metric for state "A." Pipelined ACS unit 504 calculates the state metric for state "B." Pipelined ACS unit 506 calculates the state metric for state "C." Pipelined ACS unit 508 calculates the state metric for state "D." Thus the calculation of state metrics of for a single time index such as "1" can be performed.

Pipelining of state metrics calculations across multiple time indices may involve scheduling. Here, because state metrics calculations for one time index can require the results of state metrics calculations for another time index, pipelining is not a straight forward task. According to embodiments of the invention, a system of scheduling the calculation of state metrics for different time indices is employed to ensure that such data dependencies are properly managed. The scheduling of pipelined state metrics calculations is described in further detail in later sections.

Because the operations of pipelined ACS units 502, 504, 506, and 508 are similar, the following only describes specifics of pipelined ACS unit 502. The other pipelined ACS units 504, 506, and 508 operate in a similar manner.

In the present embodiment of the invention, pipelined ACS unit 502 is organized into three stages 521, 522, and 523. That is, this ACS unit comprises a three-stage pipeline (N=3). By organizing a functional unit into a multi-state pipeline, the functional unit can more efficiently process a sequence of similar calculations. Thus, pipelined ACS unit 502 may break the ACS computation into three separate stages: "Add" performed by state 521, "Compare" performed by stage 522, and "Select" performed by stage 523. This way, pipelined ACS unit can simultaneously perform processing for three different state metrics calculations. For example, the following operations may take place at the same time: (1) stage 523 performs the "Select" operation of a state metric calculation, (2) state 522 performs the "Compare" operation for another state metrics calculation, and (3) stage 521 performs the "Add" operation for yet another state metric calculation. Without pipelining, each of these state metric calculations would occupy the entire ACS unit from the time it enters the unit until it leaves the unit. For instance, when a state metrics calculation is using the "Select" stage, the other two stages "Add" and "Compare" would sit idle without being used. Thus, pipelining significantly improve the efficiency of ACS unit 502.

Figure 6:
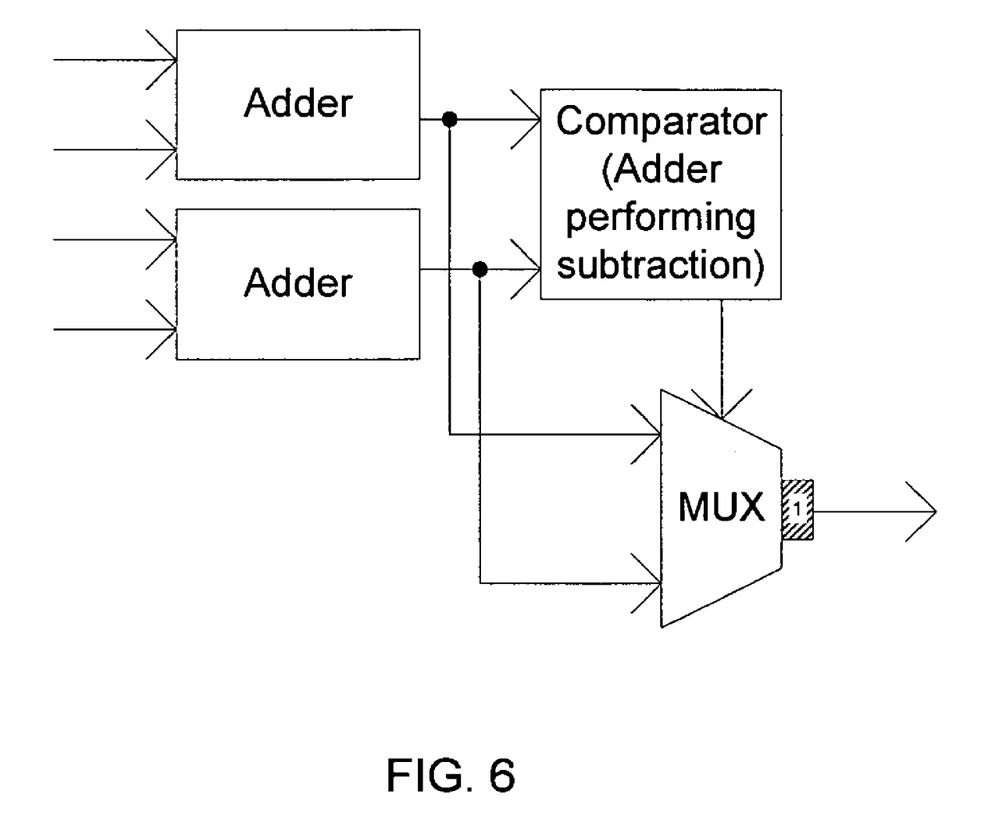
FIG. 6 shows a block diagram for an ACS unit organized into only one stage (N=1).
Figure 7:
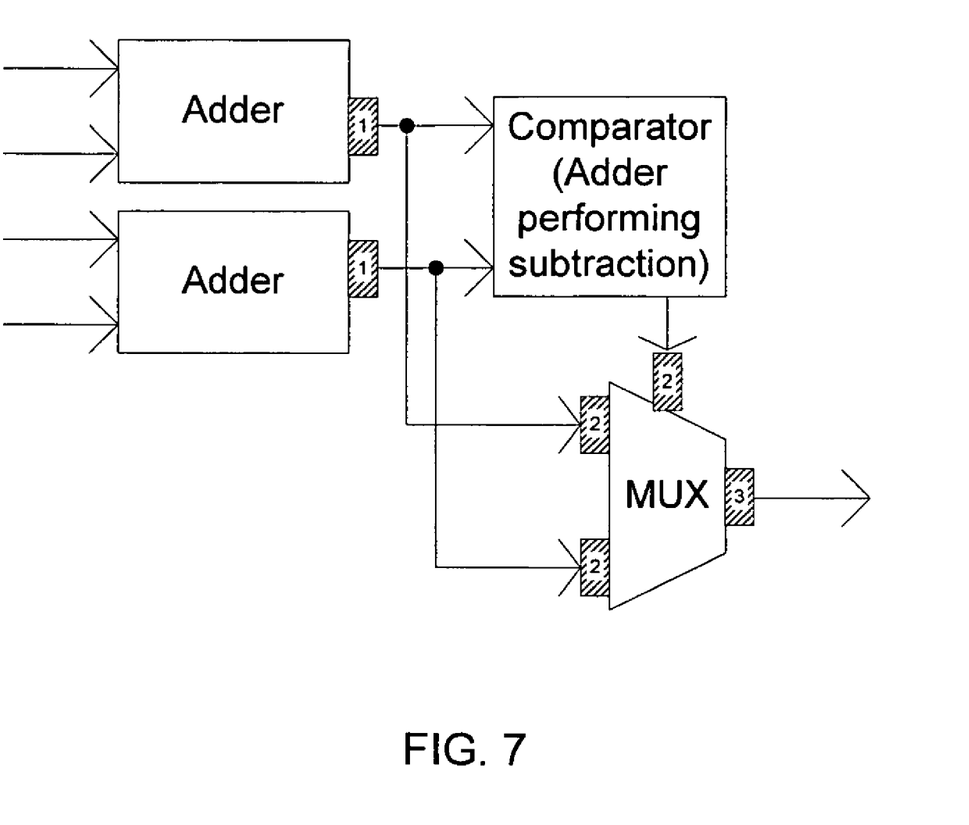
FIG. 7 shows a block diagram for an ACS unit organized into three stages (N=3).
Figure 8:
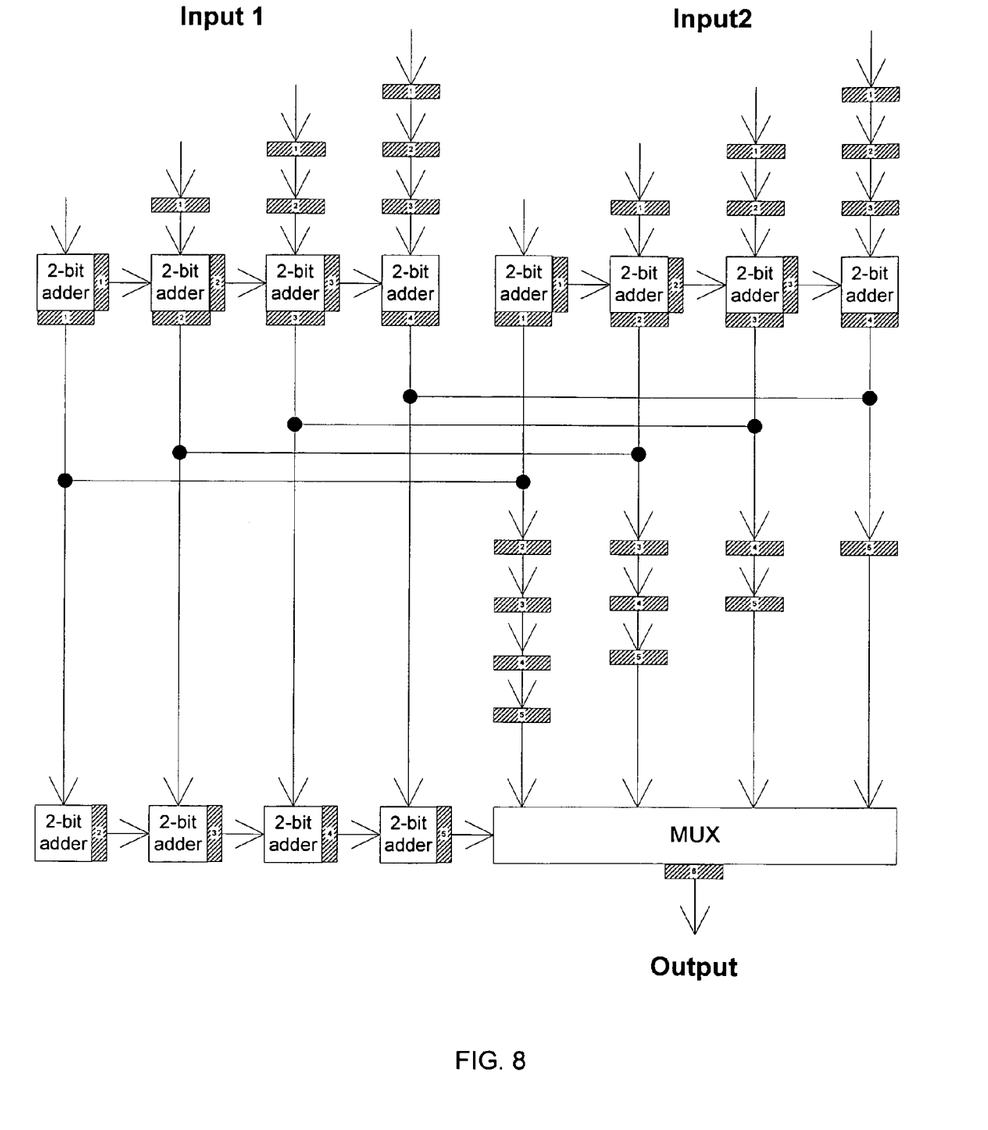
FIG. 8 shows a block diagram for an ACS unit organized into six stages (N=6).

FIGS. 6-8 present various examples of ACS units organized into different numbers of stages is below. Here again, it is assumed for purposes of illustration that a min-sum algorithm is used for the trellis processing. For simplicity, a 2-state binary code is shown. However, more complex codes can also be adopted as would be appreciated by one of ordinary skill in the art. Also, while only one ACS unit is shown in each of these figures, it should be understood that in a state-update unit, multiple ones of such ACS units can be used in parallel, one for each state. Because such ACS units operate in parallel, a binary code with more states would just include more instances of the ACS units. If the code is not binary, logic may be added to each ACS unit so that it can perform more comparisons (binary codes only require one).

FIG. 6 shows a block diagram for an ACS unit organized into only one stage (N=1). The ACS calculates the state metric for one of the states in the trellis for a particular time index. Since in our example the code is binary there are two paths that lead to a particular state. So the ACS unit first forms two sums, each one calculated by adding the state metric of the originating state to the branch metric for the corresponding transition. The resulting metrics are then compared with each other and the minimum metric is selected as the state metric for the current state. The mathematical representation of the operation is the one shown in Equation (3). A rectangle labeled "1" identifies the single stage in this ACS unit. The originating state metrics are calculated during the previous recursion of the algorithm. The recursive nature of this calculation is the reason why existing systems typically perform the entire ACS operation in a single stage (N=1), without pipelining. The inability to use pipelining in the state-update operation limits the performance of the entire circuit for the decoder.

FIG. 7 shows a block diagram for an ACS unit organized into three stages (N=3). As shown, the add-compare-select process is pipelined into three states using well-known strategies for breaking up the operation in much smaller pieces. In FIG. 7, the same ACS operation as shown in FIG. 6 is now broken up into three pipelined stages. Rectangles labeled "1" identify the first stage, rectangles labeled "2" identify the second stage, and rectangles labeled "3" identify the third stage. By organizing the ACS unit into three stages, the state-update operation can be pipelined as discussed previously. For instance, FIG. 7 may be an implementation of each of the three-stage ACS units 502, 504, 506, and 508 shown in FIG. 5.

FIG. 8 shows a block diagram for an ACS unit organized into six stages (N=6). Here, the state metrics processed are 8-bit values. Three groups of 2-bit adders are used. Each group consists of four 2-bit adders connected together by "carry" lines. Again, the ACS unit first forms two sums, each one calculated by adding the state metric of the originating state to the branch metric for the corresponding transition. The first groups of 2-bit adders calculates one of the two sums. The second group of 2-bit adders calculates the other of the two sums. The two resulting metrics are then compared with each other. The third group of 2-bit adders performs this comparison, by performing a subtraction operation (i.e., by adding the first value to the negative of the second value). As can be seen in FIG. 8, each group of 2-bit adders is further broken into finer stages of execution, which increases the total number of stages for the ACS unit. Finally, a multiplexer (MUX) performs a selection operation to select the minimum of the two resulting metrics, as the state metric for current state. As shown in FIG. 8, the ACS operation is organized into six stages. Rectangles labeled "1" through "6" identify these stages.

The number of stages shown in FIGS. 6-8 affect the number of cycles needed to accomplish the ACS operation. For example if each stage requires one cycle to complete, then the number of cycles needed would be equal to the number of stages. Depending on the desired speed and the architecture, a state-update unit such as an ACS unit can be broken into any arbitrary number of stages. All implementations of the state-update operation (including min*-sum, max-product, sum-product, etc.) could be pipelined in accordance with different embodiments of the present invention.

V. Scheduling for a Pipelined State-Update Unit

As mentioned previously, because state metrics calculations for one time index may require the results of state metrics calculations for another time index, pipelining is not a straight forward task. According to embodiments of the invention, a system of scheduling the calculation of state metrics for different time indices is employed to ensure that such data dependencies is properly managed.

Generally speaking, if the state-update operation is broken down in N stages then the results of the state-update operation will be ready N cycles later (assuming each stage executes in one cycle), and the next state-metric calculation cannot proceed until then. To fill in the empty time slots, state-update operations are performed for states from other sections of the trellis in accordance with embodiments of the present invention.

Assuming the state-update operation has been designed with an N-stage pipeline (N>1), the block of data represented by the trellis can be broken into M sections, or sub-blocks. In one preferred embodiment, M is equal to N. In another preferred embodiment, M is an integer multiple of N, if the number of sub-blocks is larger than N. State updates for states from different sub-blocks can then be processed in the pipelined circuit, one after the other utilizing the state-update unit at its maximum rate. After N cycles the first sub-block will produce its next state metrics. Those will be input back into the state-update unit with the second set of branch metrics that correspond to that particular sub-block. The next cycle the second sub-block will finish and start its second calculation. So each state metric calculation will take N cycles but it can be done for M sub-blocks in an interlaced fashion. That means that the first state-update has to first finish for all M sub-blocks before the second one starts for any of them. In one embodiment, the sub-blocks will take turns using the unit following a regular round-robin scheduling algorithm.

If the number M of sub-blocks (could be tiles or windows) is more than N, then once a sub-block is finished with all L state calculations a new one can take its place in the pipeline schedule to keep the unit fully utilized. In fact there is technically no restriction for the sub-blocks to be of the same length, but typically that should yield optimum utilization for the unit.

Referring back to FIG. 4, this figure illustrates an example of scheduling of pipelined state metrics calculations. Here, the calculation of state metrics for states "A" through "D" is performed using a set of computation resources. The same set of computational resources is used to calculate these state metrics for time indices "1" through "9." To promote efficiency, the computation resources are pipelined to simultaneously handle state metrics calculations for more than one of the time indices. However, because state metrics calculations for one time index can depend on results of state metrics calculations for another index, i.e., the calculations can be recursive in nature, proper scheduling is applied so that the data depended on would always be produced on time by the pipelined process.

For illustration, the scheduling of pipelined calculations for Forward state metrics is discussed here. A similar procedure can be used in the scheduling of pipelined calculations for Backward state metrics, in the reverse time direction. As mentioned previously, trellis 400 in FIG. 4 is divided into multiple sections 402, 404, and 406 for which decoding can be performed separately. Here, the pipelined computation resources are assumed to be organized into three stages (M=3). The pipelined computation resources are used to process state metrics for the various time indices in the following order: "1," "4," "7," "2," "5," "8, " "3," "6," and "9." This ordering of state metrics calculations in the present example allows data dependencies to be properly managed, as explained in more detail below.

Referring back to FIG. 5, the pipelined computation resources are implemented as the four individual pipelined Add-Compare-Select (ACS) units 502, 504, 506, and 508, which operate in parallel to compute state metrics for different states at each time index of a trellis. Specifically, ACS unit 502 is responsible of calculating state metrics for state "A." ACS unit 504 is responsible of calculating state metrics for state "B." ACS unit 506 is responsible of calculating state metrics for state "C." ACS unit 508 is responsible of calculating state metrics for state "D."

Each of ACS units 502, 504, 506, and 508 is organized into three stages (N=3). The calculation of state metrics for different states at different time indices move through the three stages of ACS units 502, 504, 506, and 508 in a pipelined fashion. Just as an example, the operation of ACS unit 502, to calculate state metrics of state "A" at different time indices, is described. As FIG. 5 shows, at a particular moment during the decoding process, the state metric for state "A" at time index "1" (labeled "1A") is being calculated in the third and final stage (e.g., "Select" stage") of ACS unit 502. At the same time, the state metric for state "A" at time index "4" (labeled "4A") is being calculated in the second stage (e.g., "Compare" stage) of ACS unit 502. At the same time, the state metric for state "A" at time index "7" is being calculated in the first stage (e.g., "Add" stage) of ACS unit 502.

Here, pipelined state metrics calculations are scheduled according to the time index order "1," "4," "7," "2," "5," "8," "3," "6," and "9." In the case of Forward state metrics, the state metrics for time index "2" depend on the state metrics for time index "1." This scheduling ensures that by the time that ACS units 502, 504, 506, and 508 begin to calculate the state metrics for time index "2," the state metrics for time index "1" are already available. Because the calculation of state metrics for time index "1" precedes the calculation of state metrics for time index "2" by three time indices, and the pipeline has three stages (M=3), the results for time index "1" exit the third and final stage of the pipeline just in time to be used in the calculation for time index "2." In this manner, scheduling of state metric calculations allows proper management of data dependencies that exist in the state metrics calculations.

Accordingly, FIG. 5 presents an example of scheduling calculations in a pipelined process, wherein the pipelined process is used to calculate state metrics at a first time index (e.g., "1"), wherein the pipelined process is then used to calculate state metrics at one or more non-adjacent time indices (e.g., "4" and "7") that are not adjacent to the first time index, without using results from the calculation of state metrics at the first index, and wherein the pipelined process is then used to calculate state metrics at an adjacent time index ("2") that is adjacent to the first time index, using results from the calculation of state metrics at the first index. Here, the pipelined process is implemented in hardware as ACS units 502, 504, 506, and 508.

There are significant benefits associated with the pipelining of state-update operations. One benefit is the increase in circuit speed and/or reduction in circuit area associated with hardware implementations of the trellis-based decoding operations. Generally speaking, when an operation is broken down in N smaller segments, the final circuit may be able to run up to N times faster. So the proposed architecture using the scheduling to achieve maximum pipeline utilization has the potential to achieve with one pipelined unit the processing speed of N non-pipelined units operating in parallel. The sequential logic increases due to pipelining, but the combinational part of the circuit does not change. Therefore the resulting circuit should be smaller than N units in parallel where the logic has to be replicated exactly N times. These savings extends to the rest of the design, since the other parts of the decoder are easy to pipeline as well.

Another significant benefit that may not be immediately apparent relates to the memory design required for the decoder. Typically the memory runs at the same speed as the decoder to make system integration easy. With multiple slow units one needs multiple simultaneous accesses to memory and that translates into multiple shallow and wide RAM instances. In the case of Turbo and Turbo-like codes the problem becomes even more challenging since all these parallel accesses are to the shared memory space of the interleaver, and special logic, such as crossbar switches need to be employed to resolve the clashes that occur during the memory accesses. Even if they are resolved they still put significant constraints on the interleaving pattern.

Moreover, the shallow and wide RAMs require a lot more area and power to access than narrower and deeper memories of the same type and capacity. By using fewer fast units instead, one should be able to use fewer instances of deeper and narrower memory blocks resulting in significant area and power savings. At the same time less logic is required to accommodate the parallel memory accesses and the constraints on the interleaver are significantly relaxed. In most ASIC and FPGA technologies there are memory solutions available that could run several times faster than a complex state-update operation and so far one could not take advantage of their capabilities. Using the architecture described here one could run the logic as fast as the memory available is and take advantage of their full potential.

VI. Conclusion

Pipelining of state-update calculations is achieved by scheduling calculations for states from different sections of a trellis. This allows the concepts of windowing and/or tiling to be adopted in an innovative manner to facilitate pipelined state-update calculations. Although the concepts of windowing and tiling are widely known in the art, they have not been adopted to solve the state-update recursion bottleneck problem for trellis-based processors and decoders until the present invention.

Thus, efficient pipelining can be applied to not only the branch metric calculation step and trace back/completion step of trellis-based processing, but also to the recursive state-update step. This allows very-high-throughput trellis processing to be implemented using one or more pipelined computational units. The benefits of using a single fast unit to replace several slower ones are significant in terms of total circuit area, power and in terms of memory design.

Specific examples have been described above assuming the simple case of a 2-state binary code using a min-sum implementation. Also, low complexity trellis structures are presented for ease of illustration. However, the same principles can easily applied to other codes, with more states and/or more complex structures, as well as different decoding algorithms, such as max-product, sum-product, min*-sum, and max*-sum algorithms or any of their practical approximations.

The techniques presented here may be implemented in hardware using gated logic that forms part of a custom chip, such as an ASIC (Application Specific Integrated Circuit), or a programmable FPGA (Field Programmable Gate Array). These techniques may be used as part of a decoder, a SISO, a trellis processor or even as a hardware accelerator for a general-purpose processor that needs to perform these types of operations.

While the present invention has been described in terms of specific embodiments, it should be apparent to those skilled in the art that the scope of the present invention is not limited to the described specific embodiments. The specification and drawings are, accordingly, to be regarded in an illustrative rather than a restrictive sense. It will, however, be evident that additions, subtractions, substitutions, and other modifications may be made without departing from the broader spirit and scope of the invention as set forth in the claims.

What is claimed is:

1. A method for extracting information from a received signal resulting from a process capable of being represented as a finite state machine having a plurality of states, wherein transitions between the states can be represented using a trellis spanning a plurality of time indices, the trellis comprising the plurality of states at each time index, the method comprising:

calculating branch metrics corresponding to transitions from one state to another state, taking into account the received signal;

calculating state metrics corresponding to states at each time index by taking into account the branch metrics and using a pipelined process, wherein the pipelined process is used to calculate state metrics at a first time index, wherein the pipelined process is then used to calculate state metrics at one or more non-adjacent time indices that are not adjacent to the first time index, without using results from the calculation of state metrics corresponding to states at the first index, wherein the state metrics for the at least one or more non-adjacent time indices are calculated at least in part in parallel with the state metrics at the first time index, and wherein the pipelined process is then used to calculate state metrics at an adjacent time index that is adjacent to the first time index, using results from the calculation of state metrics at the first index; and generating at least one output by taking into account state metrics for states associated with at least one selected path through the trellis.

2. The method of claim 1, wherein the trellis can be divided into multiple sections, each section spanning a smaller plurality of the plurality of time indices;

wherein the first time index is a time index from a first section of the trellis;

wherein the one or more non-adjacent time indices are time indices from one or more other sections of the trellis; and wherein the adjacent time index is another time index from the first section of the trellis.

3. The method of claim 2 wherein the pipelined process is used to calculate state metrics at time indices from different sections of the trellis in a round-robin manner.

4. The method of claim 2 wherein the pipelined process comprises N stages, N being a positive integer, and wherein the trellis is divided into M sections, M being a positive integer equal to N.

5. The method of claim 2 wherein the pipelined process comprises N stages, N being a positive integer, and wherein the trellis is divided into M sections, M being a positive integer greater than N.

6. The method of claim 5, wherein M is a multiple of N.

7. The method of claim 1 wherein the calculation of state metrics comprises calculation of forward state metrics.

8. The method of claim 1 wherein the calculation of state metrics comprises calculation of backward state metrics.

9. The method of claim 1 wherein the pipelined process is configured to perform at least one add-compare-select (ACS) operation.

10. The method of claim 1 wherein the pipelined process is implemented in hardware using gated logic.

11. The method of claim 10 wherein the gated logic is part of an Application Specific Integrated Circuits (ASIC) design.

12. The method of claim 10 wherein the gated logic is part of a Very Large Scale Integrated Circuits (VLSI) design.

13. The method of claim 10 wherein the gated logic is part of a Field Programmable Gate Arrays (FPGA) design.

14. The method of claim 1 wherein the calculation of branch metrics is performed using a pipelined process.

15. The method of claim 1 wherein the generation of the at least one output is performed using a pipelined process.

16. An apparatus for extracting information from a received signal resulting from a process capable of being represented as a finite state machine having a plurality of states, wherein transitions between the states can be represented using a trellis spanning a plurality of time indices, the trellis comprising the plurality of states at each time index, the apparatus comprising:

a branch metrics unit capable of calculating branch metrics corresponding to transitions from one state to another state, taking into account the received signal;

a pipelined state-update unit capable of calculating state metrics corresponding to states at each time index by taking into account the branch metrics, wherein the pipelined state-update unit is capable of calculating state metrics at a first time index, wherein the pipelined state-update unit is capable of then calculating state metrics at one or more non-adjacent time indices that are not adjacent to the first time index, without using results from the calculation of state metrics corresponding to states at the first index, wherein the state metrics for the at least one or more non-adjacent time indices are calculated at least in part in parallel with the state metrics at the first time index, and wherein the pipelined state-update unit is capable of then calculating state metrics at an adjacent time index that is adjacent to the first time index, using results from the calculation of state metrics at the first index; and an output unit capable of generating at least one output by taking into account state metrics for states associated with at least one selected path through the trellis.

17. The apparatus of claim 16, wherein the trellis can be divided into multiple sections, each section spanning a smaller plurality of the plurality of time indices;

wherein the first time index is a time index from a first section of the trellis;

wherein the one or more non-adjacent time indices are time indices from one or more other sections of the trellis; and wherein the adjacent time index is another time index from the first section of the trellis.

18. The apparatus of claim 17 wherein the pipelined state-update unit is used to calculate state metrics at time indices from different sections of the trellis in a round-robin manner.

19. The apparatus of claim 17 wherein the pipelined state-update unit comprises N stages, N being a positive integer, and wherein the trellis is divided into M sections, M being a positive integer equal to N.

20. The apparatus of claim 17 wherein the pipelined state-update unit comprises N stages, N being a positive integer, and wherein the trellis is divided into M sections, M being a positive integer greater than N.

21. The apparatus of claim 20, wherein M is a multiple of N.

22. The apparatus of claim 16 wherein the calculation of state metrics comprises calculation of forward state metrics.

23. The apparatus of claim 16 wherein the calculation of state metrics comprises calculation of backward state metrics.

24. The apparatus of claim 16 wherein the pipelined state-update unit is configured to perform at least one add-compare-select (ACS) operation.

25. The apparatus of claim 16 wherein the pipelined state-update unit is implemented in hardware using gated logic.

26. The apparatus of claim 25 wherein the gated logic is part of an Application Specific Integrated Circuits (ASIC) design.

27. The apparatus of claim 25 wherein the gated logic is part of a Very Large Scale Integrated Circuits (VLSI) design.

28. The apparatus of claim 25 wherein the gated logic is part of a Field Programmable Gate Arrays (FPGA) design.

29. The apparatus of claim 16 wherein the branch metrics unit is pipelined.

30. The apparatus of claim 16 wherein the output unit is pipelined.

31. A system for extracting information from a received signal resulting from a process capable of being represented as a finite state machine having a plurality of states, wherein transitions between the states can be represented using a trellis spanning a plurality of time indices, the trellis comprising the plurality of states at each time index, the system comprising:

means for calculating branch metrics corresponding to transitions from one state to another state, taking into account the received signal;

means for calculating state metrics corresponding to states at each time index by taking into account the branch metrics and using a pipelined process, wherein the pipelined process is used to calculate state metrics at a first time index, wherein the pipelined process is then used to calculate state metrics at one or more non-adjacent time indices that are not adjacent to the first time index, without using results from the calculation of state metrics corresponding to states at the first index, wherein the state metrics for the at least one or more non-adjacent time indices are calculated at least in part in parallel with the state metrics at the first time index, and wherein the pipelined process is then used to calculate state metrics at an adjacent time index that is adjacent to the first time index, using results from the calculation of state metrics at the first index; and means for generating at least one output by taking into account state metrics for states associated with at least one selected path through the trellis.

* * * * *